(12) United States Patent
Jungerman

(10) Patent No.: US 6,629,272 B1
(45) Date of Patent: Sep. 30, 2003

(54) METHOD AND APPARATUS FOR DISPLAYING EYE DIAGRAM ON AN ERROR PERFORMANCE ANALYZER

(75) Inventor: Roger Lee Jungerman, Petaluma, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 475 days.

(21) Appl. No.: 09/711,264

(22) Filed: Nov. 9, 2000

(51) Int. Cl.⁷ .......................................... G01R 31/3181
(52) U.S. Cl. ....................................... 714/704; 714/735
(58) Field of Search ................................ 714/704–709, 714/735, 740

(56) References Cited

U.S. PATENT DOCUMENTS 4,428,076 A * 1/1984 Schuon ........................ 714/704
5,652,668 A * 7/1997 Aulet et al. .................. 359/110
6,430,715 B1 * 8/2002 Myers et al. ................. 714/704
6,433,899 B1 * 8/2002 Anslow et al. ............... 359/110

FOREIGN PATENT DOCUMENTS

JP       2001352350 A  * 12/2001    ........... H04L/25/02

* cited by examiner

Primary Examiner—R. Stephen Dildine

(57) ABSTRACT

A method and apparatus for displaying an eye diagram on an error performance analyzer are disclosed. A first bit sequence is received and compared with a second bit sequence, the first bit sequence and the second bit sequence being substantially similar. For each delay increment for an entire clock period a bit error rate (BER) curve is constructed. The BER curve is then used to locate the bit voltage or bit voltage spread for the 0-bit and the 1-bit for a particular delay. This is repeated a predetermined number of times to cover an entire period. Then, the bit voltages or bit voltage spreads are displayed as an eye diagram.

24 Claims, 4 Drawing Sheets

METHOD AND APPARATUS FOR DISPLAYING EYE DIAGRAM ON AN ERROR PERFORMANCE ANALYZER

BACKGROUND

The present invention relates to error performance analyzers. More specifically, the present invention relates to the method and apparatus for displaying eye diagrams of binary digit transmission using bit error ratio testers, or BERTs.

A fundamental measure of quality of digital circuits, switches, and transmission systems is the probability of any stored or transmitted bit being transmitted in error, or bit error ratio (BER). The BER is typically tested using a bit error ratio tester (BERT) which may include of a pattern generator and an error detector. The pattern generator and the error detector are often combined in a single unit though this is not required. They are, in fact, sometimes separate units. The pattern generator generates a known sequence of bits (sequence of zeros and ones) for transmission through a device under test (DUT). The error detector receives the bit sequence from the DUT representing the known bit sequence as transmitted through the DUT. The error detector compares the received bit sequence with the known bit sequence for error bit detection. An error bit is a bit that is sent to the DUT as a zero but transmitted by the DUT as a one, or a bit that is sent to the DUT as a one but transmitted by the DUT as a zero. Then, the number of error bits is compared with the number of bits sent. The ratio of the error bits to the sent bits is the bit error ratio, BER. With modern devices, the BER may be very low and may be on the order of $10^{-12}$ or even less.

As discussed, an error detector provides the BER as one measure of quality of the DUT. The BER is a single value ratio of the number of error bits compared to the total number of bits sent; however, the error detector does not show the quality of the signal (representing the bit sequence) received from the DUT. That is, the BER provided by the error detector does not show the quality of the signal behind the BER and provide no indications of the DUT performance regarding signal degradation, timing jitter, pulse degradation, intersymbol interference, or other quality issues. To obtain such information, the bit sequence from the DUT is typically displayed as an eye diagram using an oscilloscope. The eye diagram is a multivalued display overlapping all the 0-bit signals and 1-bit signals of the bit sequence. FIG. 3 illustrates a sample. eye diagram which is discussed in more detail herein below. The large open area in the center of the pulse is called the eye opening. The distance between the top and the bottom at the center of the pulse is called the eye height while the distance between the transitions is called the eye width. The uses of the eye diagram and the methods of generating the eye diagram using an oscilloscope are well known in the art.

In summary, for a comprehensive testing of a DUT, two devices are needed—an error detector and an oscilloscope. However, the use of the oscilloscope adds to the hardware requirements and costs to the DUT testing process. It would be preferable to display the eye diagram using the error detector alone. Accordingly, there is a need for a technique and an apparatus to obtain the BER as well as to display the eye diagram without the use of an oscilloscope.

These needs are met by the present invention. According to one embodiment of the present invention, a technique of displaying an eye diagram on an error performance analyzer is disclosed. First, a first bit sequence comprising 0-bits signified by a first bit voltage, $V_{LB}$, and 1-bits signified by a second bit voltage, $V_{HB}$, are received; the bits of the first bit sequence have a period. Then, beginning at a first delay time and repeating at each incremental time thereafter until at least one period is spanned, first combined voltage, $V_{LC}$, and a second combined voltage, $V_{HC}$, of the bits of the first bit sequence are determined by comparing the first bit sequence of bits to a second bit sequence, the bit second sequence being substantially similar to the first bit sequence. Finally, the first combined voltages and second combined voltages are displayed as an eye diagram.

According to another aspect of the invention, an eye diagram is displayed using a first and a second combined voltages. First, a first bit sequence comprising 0-bits signified by a first bit voltage, $V_{LB}$, and 1-bits signified by a second bit voltage, $V_{HB}$, are received; the bits of the first bit sequence having a period. Then, beginning at a first delay time and repeating at each incremental time thereafter until at least one period is spanned, first combined voltage spread and a second combined voltage spread of the bits of the first sequence are determined by comparing the first bit sequence to a second bit sequence, the second bit sequence substantially similar to the first bit sequence. Finally, the first combined voltage spreads and second combined voltage spreads are displayed as an eye diagram.

According to yet another aspect of the invention, an apparatus includes a processor and storage connected to the processor, the storage including instructions for the processor to receive a first bit sequence comprising 0-bits signified by a first bit voltage, $V_{LB}$, and 1-bits signified by a second bit voltage, $V_{HB}$, the bits of the first bit sequence having a period. Further, additional instructions include the instructions to determine, beginning at a first delay time and repeating at each incremental time thereafter until at least one period is spanned, first combined voltage spread and a second combined voltage spread of the bits of the first sequence by comparing the first bit sequence to a second bit sequence, the second bit sequence substantially similar to the first bit sequence, and instructions to display the first combined voltage spreads and second combined spreads.

Other aspects and advantages of the present invention will become apparent from the following detailed description, taken in conjunction with the accompanying drawings, illustrating by way of example, the principles of the present invention.

DETAILED DESCRIPTION

Figure 1:
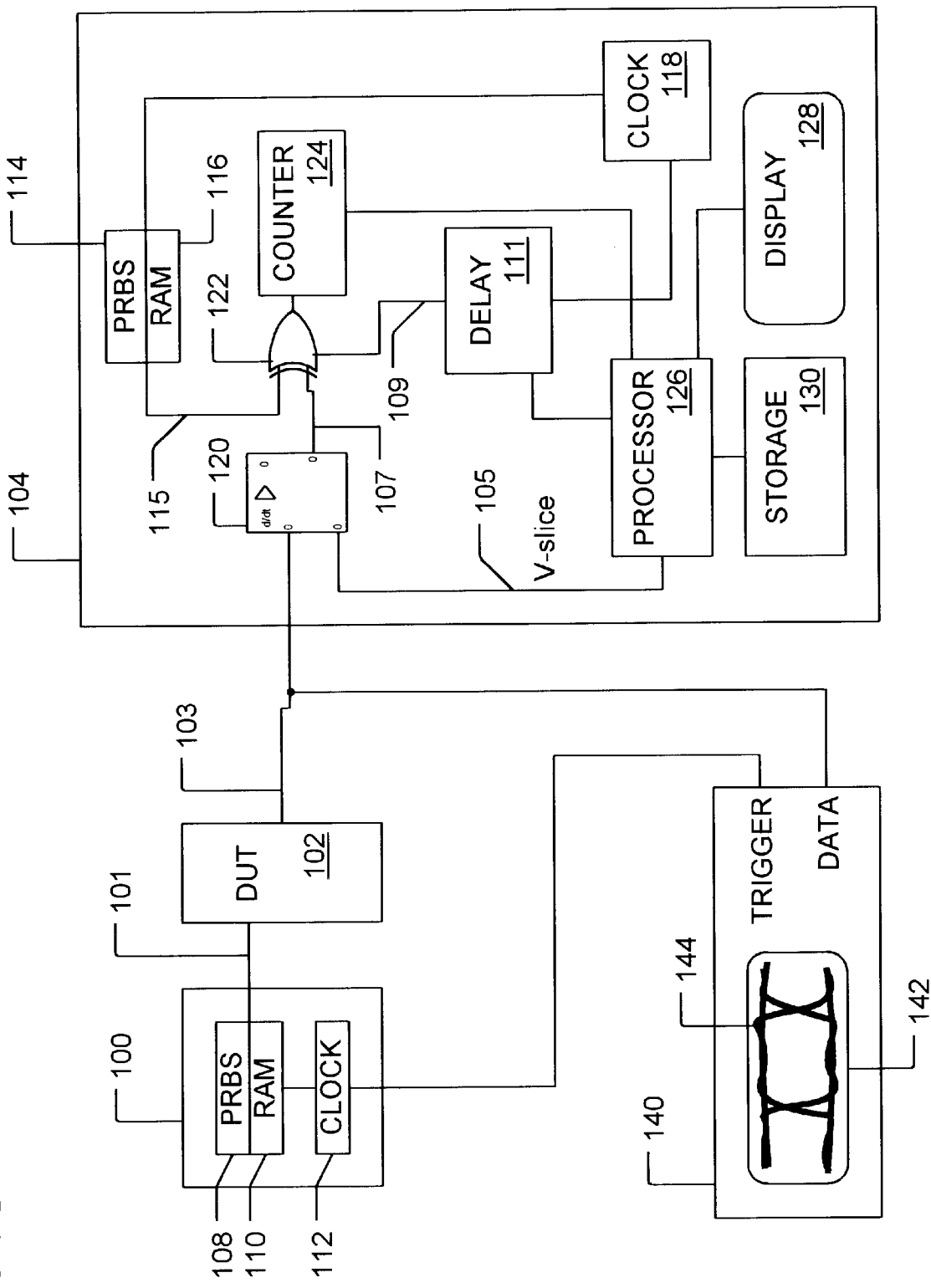
FIG. 1 illustrates a bit error rate testing configuration in simplified blocks.

As shown in the drawings for purposes of illustration, the present invention is embodied in a technique and an apparatus for displaying eye diagram using an error performance analyzer. The bit voltages of the bits received by the error performance analyzer, an error detector in the example discussed below, are determined using the BER curve. First, a first bit sequence comprising 0-bits signified by a first bit voltage, $V_{LB}$, and 1-bits signified by a second bit voltage, $V_{HB}$, are received; the bits of the first bit sequence have a period. Then, beginning at a first delay time and repeating at each incremental time thereafter until at least one period is spanned, first combined voltage spread and a second combined voltage spread of the bits of the first sequence are determined by comparing the first bit sequence to a second bit sequence, the second bit sequence substantially similar to the first bit sequence. Finally, the first combined voltage spreads and second combined voltage spreads are displayed as an eye diagram.

BIT ERROR RATE TESTING CONFIGURATION

Referring to FIG. 1, a basic bit error rate testing configuration is illustrated, in a simplified manner, including a pattern generator 100, a device under test (DUT) 102, an error detector 104, and an oscilloscope 140. The pattern generator 100 sends a sequence of bits 101 to the DUT 102 for testing. The bit sequence is generated by a pseudo-random bit sequencer (PRBS) 108. Alternatively, the bit sequence for testing the DUT 102 is a fixed bit sequence that may be stored in memory 110. The pattern generator 100 has a clock 112 to synchronize its operations including the PRBS generation and transmission 101 of the bit sequence to the DUT 102.

Figure 2:
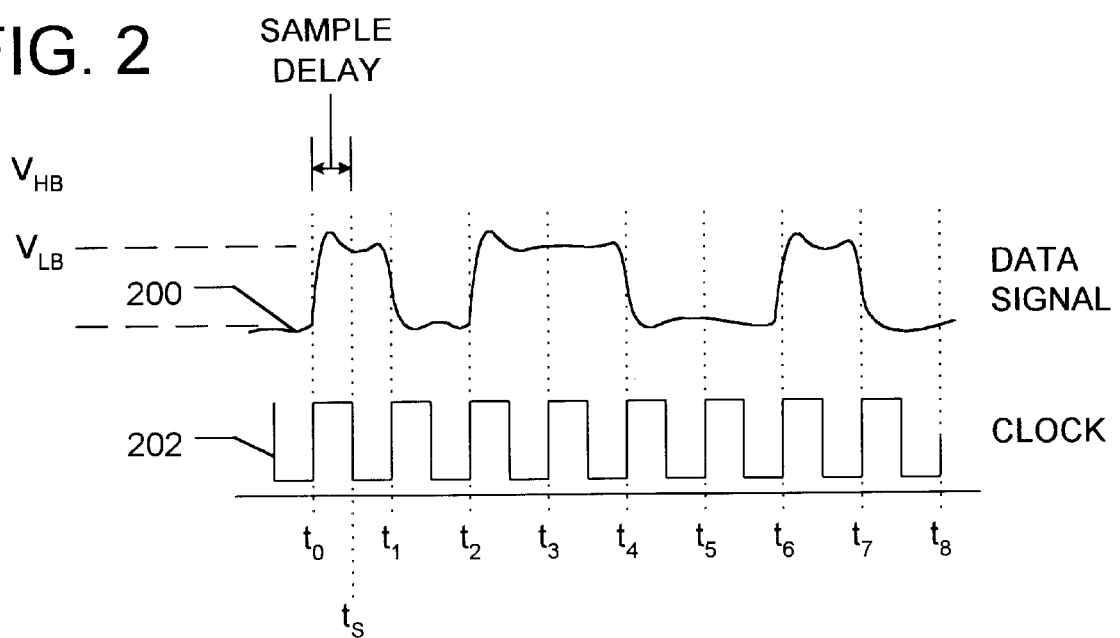
FIG. 2 illustrates a portion of a possible bit sequence.

FIG. 2 illustrates a portion of one possible bit sequence. The bit sequence signal 200 shows, as an example, an eight bit sequence of 10110010. A corresponding clock signal square wave 202 is also illustrated for eight clock periods—from time t0 to time t8. The clock signal 202 has a period of some predefined value. Accordingly, the bit sequence signal 200 has the same period as the clock signal 202 with each bit expressed within one period. The bit sequence signal 200 normally ranges from a low bit voltage, VLB, signifying one of the two binary values (0 or 1) to a high bit voltage, VHB, signifying the other of the two binary values (1 or 0). Each bit of the bit sequence signal 200 may be at the VLB, representing perhaps 0 or at the VHB representing perhaps 1. In the present example, the clock signal 202 may represent the clock signal generated by the clock 112 of the pattern generator 100 or a clock 118 of the error detector 104. Also, the bit sequence signal 200 may represent a portion of the bit sequence 101 generated by the pattern generator 100 or as transmitted by the DUT 102 and received by the error detector 104.

Continuing to refer to FIGS. 1 and 2, the bit sequence 101 is transmitted through the DUT 102 and received by the error detector 104. For convenience, the bit sequence transmitted from the DUT 102 and received by the error detector 104 will be represented by line 103 of FIG. 1 and referred to by the reference number 103. The error detector 104 may include its own PRBS 114 or memory 116 as a source of its own bit sequence. For convenience, the bit sequence from the PRBS 114 or the memory 116 will be represented by line 115 of FIG. 1 and referred to by the reference number 115. Preferably, the bit sequence 115 of the error detector 104 is identical to the bit sequence 101 of the pattern generator 100 such that the bit sequence 103 from the DUT may be compared against the bit sequence 115 of the error detector 104 (identical to the bit sequence 101 of the pattern generator) to detect errors introduced by the DUT 102. For clarity, the bit sequence 103 received by the error detector 104 may be referred to as a first bit sequence 103, and the bit sequence 115 generated by the error detector 104 may be referred to as a second bit sequence 115.

The first bit sequence 103 is received by the error detector 104 as an electrical signal having either a low bit voltage, $V_{LB}$, or a high bit voltage, $V_{HB}$. Each bit of the first bit sequence 103 is first compared with a slice voltage, $V_S$. 105 using a differential amplifier 120. Commonly, the slice voltage 105 is set between the $V_{LB}$ and the $V_{HB}$ in order to allow the differential amplifier 120 to differentiate between a 0-bit (for example, a low bit voltage signal) and a 1-bit (for example, a high bit voltage signal). After the differential amplifier 120 translates the incoming bit sequence 103 to a differentiated bit 107, the differentiated bit 107 is compared with the corresponding bit of the second bit sequence 115. Techniques to synchronize the first bit sequence 103 to the second bit sequence 115 are known in the art and need not be discussed here. This comparison operation may be provided by an exclusive—or element 122 where if the differentiated bit 107 is different from the corresponding bit of the second bit sequence 115, then the bit is in error.

As with the pattern generator 100, the error detector 104 has a clock 118 providing a clock signal to synchronize its operations. To avoid clutter, not all connections between the clock 118 and the illustrated portions of the error detector 104 are illustrated in FIG. 1. The clock 118 typically generates a clock signal similar to the clock signal 202 of FIG. 2.

Traditionally, the differentiated bit 107 is compared, or sampled, at a midpoint of the period of the bit to avoid sampling the bit during transition time. This is illustrated on FIG. 2. For example, the first bit of the bit sequence signal 200 having a period from $t_0$ to $t_1$ may be sampled at time $t_S$ where $t_S$ is in between $t_0$ and $t_1$. The period of time between the beginning of the period, for example, $t_0$, to the time sample is taken, for example, $t_S$, is the sample delay. The sampling delay time is controlled by a processor 126 using a delay circuit 111. Using the delay circuit 111, the processor 126 determines the sample time, $T_S$, when the sample of the translated bit is taken by controlling the sample delay relative to the beginning of the bit period. The sample time, $T_S$, is referred to by the reference numeral 109. A counter 124 counts the error bits.

The processor 126 sets the slice voltage 105, reads the counter 124, and displays the resulting BER value using a display 128. The processor 126 is connected to storage 130 for storage of various values during the operation of the processor 126.

The first bit sequence 103 is also received by an oscilloscope 140 which uses the clock signal from the clock 112 as the trigger to sweep the first bit sequence 103. Using a multivalue display 142, the oscilloscope 140 displays an eye diagram 144. Since the eye diagram 144 is a multivalue display showing an overlay of many 0-bit and 1-bit signals, the high voltage signal levels of the eye diagram 144 are referred to as (for convenience) the high combined voltage, $V_{HC}$, and the low voltage signal levels of the eye diagram are referred to as (for convenience) the low combined voltage, $V_{LC}$.

Figure 3:
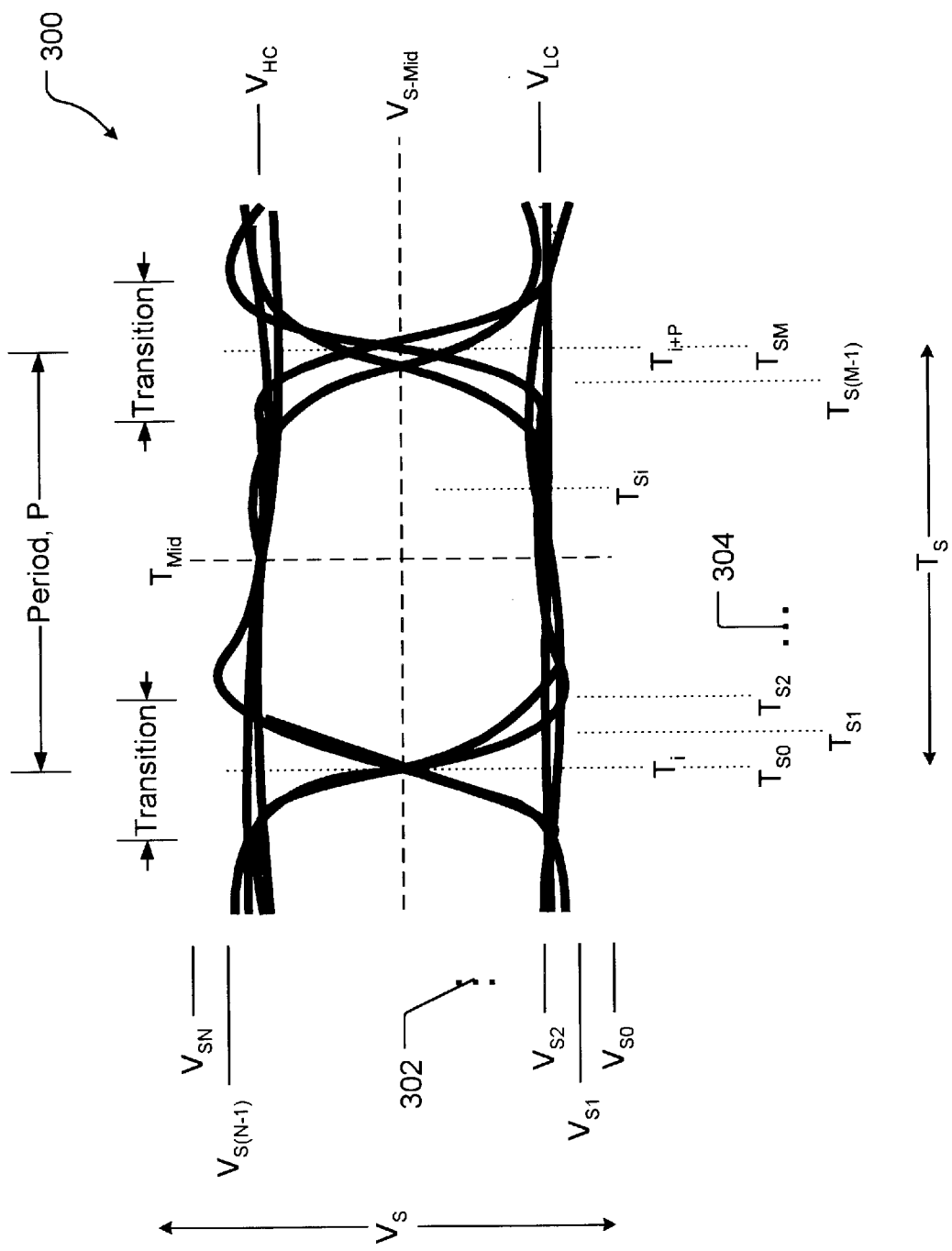
FIG. 3 illustrates an eye diagram.

FIG. 3 illustrates a sample eye diagram 300 which may be used to further discuss the present invention. The eye diagram 300 of FIG. 3 shows an overlay of many bits each having a period P as measured from the time in which a period begins, $T_i$, to the time in which the period ends, $T_{i+p}$. There is likely to be transition time at both near $T_i$ and $T_{i+p}$ as illustrated in FIG. 3. A bit has a value $V_{LB}$ (representing perhaps a 0-bit value) or a $V_{HB}$ (representing perhaps a 1-bit value). To differentiate the bit value, a differential amplifier (not shown) is used in the manner of differential amplifier 120 illustrated in FIG. 1. Referring to FIGS. 1 and 3, to merely distinguish the bit value as either a 0-bit or a 1-bit.

the slice voltage, $V_S$, 105, may be set to a value at the midpoint between $V_{HB}$ and $V_{LB}$ as illustrated in FIG. 3 as $V_{S-Mid}$. However, note that the $V_S$ 105 may be set at any voltage including values less than $V_{LB}$ or greater than $V_{HB}$. Likewise, to merely distinguish the bit value as either a 0-bit or a 1-bit the sample delay, $T_S$, 109 may be set at the midpoint between $T_i$ and $T_{i+p}$ as illustrated in FIG. 3 as $T_{S-Mid}$. However, note that the $T_S$ 109 may be set at any value including values before $T_i$ or after $T_{i+p}$.

In order to display the eye diagram on display 128, the combined voltages $V_{HC}$ and $V_{LC}$ are determined for an entire signal period. This is accomplished by determining the $V_{LC}$ and the $V_{HC}$ at a particular sampling time $T_S$, and repeating the determination process for the $V_{LC}$ and the $V_{HC}$ at each incremental time following $T_S$ for at please one clock period.

DETERMINING $V_{LC}$ AND $V_{HC}$ AT A DELAY TIME

Figure 4:
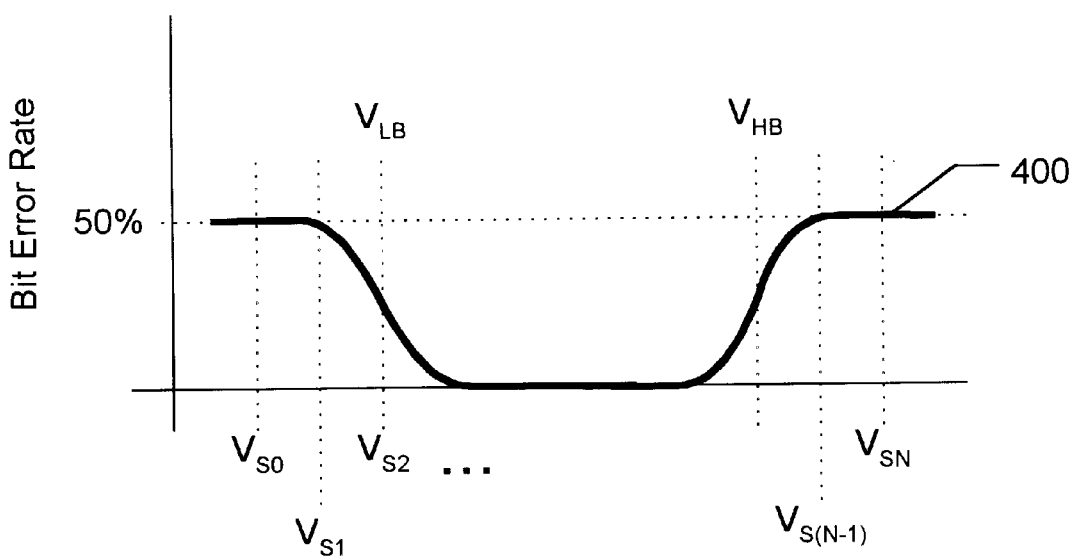
FIG. 4 illustrates a bit error rate (BER) curve constructed in accordance with one embodiment of the present invention.

To determine $V_{LC}$ and $V_{HC}$ at a particular sampling delay time $T_S$, first a BER curve is constructed at the $T_S$. FIG. 4 illustrates a sample BER curve 400 at time $T_{S-Mid}$ of FIG. 3. Referring to FIGS. 1, 3, and 4, to construct the BER curve 400, the slice voltage, $V_S$, 105 is set at an initial slice voltage $V_{S0}$ and increased incrementally to a final slice voltage $V_{SN}$ where $V_{S0}$ is less than $V_{LB}$ and $V_{SF}$ is greater than the $V_{HB}$. The number, N, of increments of the slice voltage $V_S$ between $V_{S0}$ and $V_{SN}$ is arbitrary. Incremental slice voltages are indicated in FIG. 3 by slice voltage levels $V_{S0}$, $V_{S1}$, $V_{S2}$, ellipsis 302, $V_{S(N-1)}$, and $V_N$. Changes in the slice voltage of less than one percent (1%) of the eye opening are measured corresponding to changes in the BER.

At each increment of $V_S$, including at the first increment $V_{S0}$, BER is taken for a predetermined number of bits. When the $V_S$ is at $V_{S0}$, all of the bits of the first bit sequence 103 translate as a high-bit (1-bit) because all of the first bit sequence 103 would be at a higher voltage level compared to the lower voltage level of $V_S$ at $V_{S0}$. Assuming that the first bit sequence is a PRBS sequence having approximately 50% mark density, the BER at $V_{S0}$ is 50%. This is because 50% of the bits read as 1-bits are actually 0-bits read in error as 1-bits. In general, the BER value when $V_S$ is at $V_{S0}$ is 100% minus the mark density. Note that PRBS sequences are of $2^{N-1}$ in length, and thus never have exactly 50% mark density but become correspondingly closer to 50% as N gets larger.

As already discussed, the BER value is a ratio of the bit errors of the first bit sequence 103 as translated 107 and compared to the second bit sequence 115. Preferably, the second bit sequence 115 is substantially similar or even identical to the received sequence 103. The second bit sequence 115 should be identical to the bit sequence 101 sent to the DUT 102 by the pattern generator 100. However, the DUT 102 may introduce noise or other errors causing the first bit sequence 103 to be not identical to the data bit sequence 101, thus not identical to the second bit sequence 115.

The number of bits used to determine the BER at any $V_S$ may be an arbitrary number. Better results may be obtained by using a large number; however, this requires longer time to determine the $V_{LC}$ and the $V_{HC}$. As an example, 200,000 bits were used to determine the BER at each slice voltage; however, the number of bits may be reduced to speed the measurement time or increased for greater number of samples leading to perhaps greater accuracy.

As $V_S$ approaches $V_{LB}$, the BER decreases because an increasing number of 0-bits are translated correctly as 0-bits. Thus, the number of bit errors decreases to zero as $V_S$ passes $V_{LB}$ and approaches the midpoint between $V_{LC}$ and $V_{HC}$. This is because, as $V_S$ passes $V_{LC}$ and approaches the midpoint between $V_{LC}$ and $V_{HC}$, the differential amplifier 120 correctly distinguishes the 0-bits and the 1-bits, thus reducing the bit errors.

As $V_S$ approaches $V_{HC}$, the BER increases because an increasing number of 1-bits are translated incorrectly as 0-bits. The BER continues to increase as $V_S$ passes $V_{HC}$ to $V_{SN}$, with the BER eventually leveling off at the mark density level. This is because, when the $V_S$ is much greater than $V_{HC}$, all of the bits of the first bit sequence 103 translate as a low-bit (0-bit) because all of the first bit sequence 103 would be at a lower voltage level compared to the higher voltage level of $V_S$ when $V_S$ is significantly higher than the $V_{HC}$. Assuming that the first bit sequence is a PRBS sequence having 50% mark density, the BER at $V_{SN}$ is 50%. This is because 50% of the bits read as 0-bits are actually 1-bits read in error as 0-bits.

Figure 5:
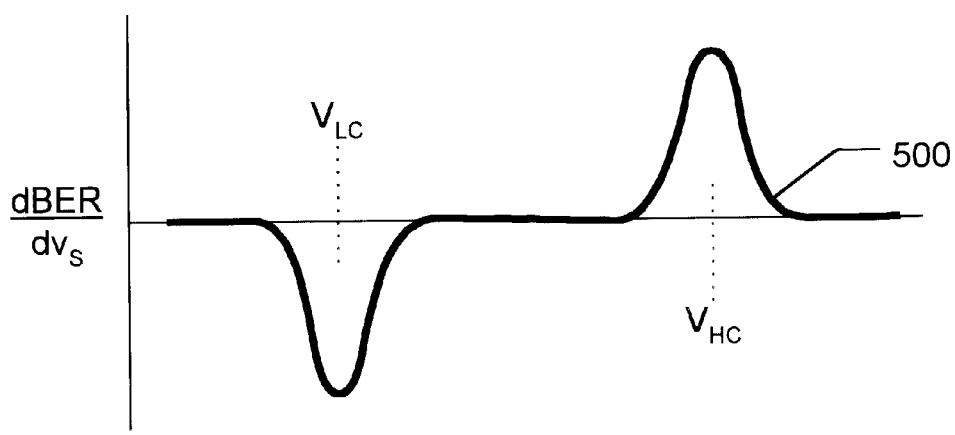
FIG. 5 illustrates a BER-derivative curve representing derivative of the BER curve of FIG. 4.

Following the construction of the BER curve 400, a derivative of the BER curve is taken with respect to the slice voltage. The derivative of the BER with respect to the slice voltage may be expressed as $dBER/dv_s$. FIG. 5 illustrates BER-derivative curve 500. Referring to FIGS. 4 and 5, around the $V_{LB}$ region, the BER-derivative curve has negative values because the BER curve 400 around the $V_{LB}$ region slopes downward as $V_S$ increase. Further, around the $V_{HB}$ region, the BER-derivative curve has positive values because the BER curve 400 around the $V_{HB}$ region slopes upward as $V_S$ increase. The BER-derivative curve 500 has zero value around the $V_{S0}$, $V_{S-Mid}$, and $V_{SN}$ because the BER curve 400 is flat around these regions.

The low combined voltage, $V_{LC}$ may be set as the slice voltage value where the BER-derivative curve is most negative. Ideally, this is the same voltage as the $V_{LB}$. Similarly, the high combined voltage, $V_{HC}$ may be set as the slice voltage value where the BER-derivative curve is most positive. Ideally, this is the same voltage as the $V_{HB}$.

DETERMINING $V_{LC}$ AND $V_{HC}$ FOR AN ENTIRE PERIOD

The $V_{LC}$ and the $V_{HC}$ for an entire clock period may be determined by repeating the above procedure for each incremental time delay spanning the entire clock period. For example, the technique discussed in the "DETERMINING $V_{LC}$ AND $V_{HC}$ AT A DELAY TIME" section above may be used at time $T_{S0}$ of FIG. 3 and at each of the incremental delay time thereafter, $T_{S1}$, $T_{S2}$, etc. to time $T_{SM}$ where M is the number of increments in the period P. Incremental delay times for sampling are indicated in FIG. 3 by delays $T_{S0}$, $T_{S1}$, $T_{S2}$, ellipsis 304, $T_{S(M-1)}$, and $T_M$.

DISPLAYING $V_{LC}$ AND $V_{HC}$ FOR AN ENTIRE PERIOD

In one embodiment of the invention, once the $V_{LC}$ and the $V_{HC}$ are determined for the entire period, these values may be displayed as the eye diagram on the display 128 of the error detector 104 of FIG. 1.

DETERMINING $V_{LC}$ SPREAD AND $V_{HC}$ SPREAD

Figure 6:
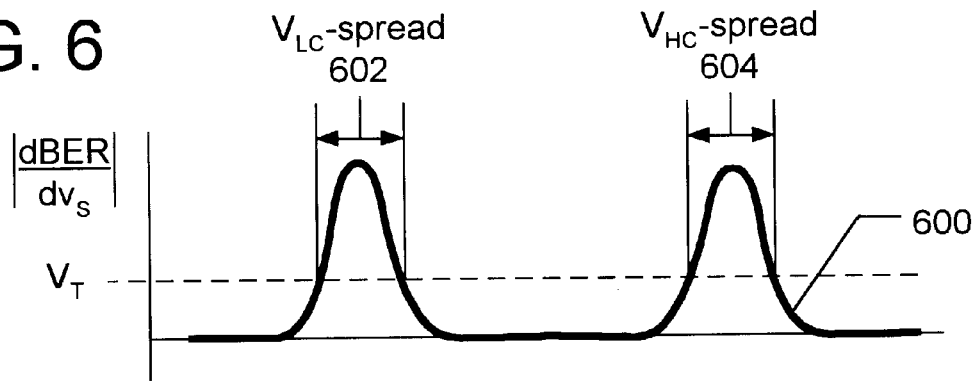
FIG. 6 illustrates a modified BER-derivative curve.

The BER-derivative curve 500 if FIG. 5 may be analyzed by plotting the absolute value of the BER-derivative curve values. FIG. 6 illustrates a modified BER-derivative curve 600 ("modified curve") where the absolute value of the BER-curve 500 of FIG. 5 is plotted. Note that the modified curve 600 has a first Gaussian portion generally around the $V_{LC}$ and a second Gaussian portion generally around the $V_{HC}$. This is because the BER curve 400 of FIG. 4 is not a square curve and has transition values ranges around the $V_{LB}$ and again around the $V_{HB}$. This, in turn, is because the low bit and the high bit signals of the first bit sequence 103 of FIG. 1 are not perfect square waves; rather the $V_{LB}$ fluctuates within a range of voltages. Likewise, the $V_{HB}$ fluctuations within a range of voltages.

Continuing to refer to FIG. 6, $V_{LC}$ spread 602 and $V_{HC}$ spread 604 may be determined for a threshold value $V_T$. In another embodiment of the invention, the $V_{LC}$ spread 602 and the $V_{HC}$ spread 604 may be determined at each sample delay increment for the entire period. Then, these values may be displayed as the eye diagram on the display 128 of the error detector 104 of FIG. 1. Note that the low combined voltage spread is a range of slice voltage values around where derivative of the BER curve is most negative, and the high combined voltage spread is a range of slice voltage values where derivative of the BER curve is most positive.

APPARATUS

Referring again to FIG. 1, an apparatus according to the present invention has the processor 126 and storage 130. The storage 130 includes instructions for the processor to utilize the all other portions of the error detector 104 to perform the operations described herein above to display the resulting eye diagram. In summary, the instructions include, without limitation, instructions for the processor 126 to receive the first bit sequence 103 comprising 0-bits signified by a first bit voltage, $V_{LB}$, and 1-bits signified by a second bit voltage, $V_{HB}$, the bits of the first bit sequence having a period. Then, to determine, beginning at a first delay time, $T_{S0}$ of FIG. 3, and repeating at each incremental time thereafter until at least one period is spanned, the low combined voltage spread and a high second combined voltage spread of the bits of the first bit sequence 103 by comparing the first bits sequence 103 to a second bit sequence 11, the second bit sequence 115 substantially similar to the first bit sequence 103. Finally, the storage 130 includes instructions for displaying the low combined voltage spread and the high combined voltage spread for each of the delay time as an eye diagram.

From the foregoing it will be appreciated that the above described technique and apparatus for displaying an eye: diagram on an error performance analyzer reduce hardware requirements because an oscilloscope is not needed. Although specific embodiments of the present invention have been described and illustrated, the invention is not to be limited to the specific forms or arrangements of parts so described and illustrated. For example, non-PRBS bit sequence may be used to test the DUT or to display the eye diagram. The invention is limited only by the claims.

What is claimed is:

1. A method of displaying an eye diagram on an error performance analyzer comprising:
    a. receiving a first bit sequence having 0-bits signified by a first bit voltage, $V_{LB}$, and 1-bits signified by a second bit voltage, $V_{HB}$, the bits of the first bit sequence having a period;
    b. determining, beginning at a first delay time and repeating at each incremental time thereafter until at least one period is spanned, a first combined voltage, $V_{LC}$, and a second combined voltage, $V_{HC}$, of the bits of the first bit sequence by comparing the first bit sequence of bits to a second bit sequence, the second bit sequence being substantially similar to the first bit sequence; and
    c. displaying the first combined voltages and second combined voltages.

2. The method recited in claim 1 wherein the first combined voltage and the second combined voltage are determined by obtaining bit error rate (BER) curve at the first delay, the BER curve spanning from a low slice voltage to a high slice voltage wherein the low slice voltage is less than the first bit voltage and wherein the high slice voltage is greater than the second bit voltage.

3. The method recited in claim 2 wherein the first combined voltage is a slice voltage, $V_S$, where derivative of the BER curve is most negative.

4. The method recited in claim 2 wherein the second combined voltage is a slice voltage, $V_S$, where derivative of the BER curve is most positive.

5. The method recited in claim 2 wherein a BER curve is obtained at each incremental delay time following the first delay time.

6. The method recited in claim 5 wherein a derivative of each of the BER curve is taken to determine the first combined voltage and the second combined voltage for each incremental delay time.

7. The method recited in claim 6 wherein the first combined voltage is a slice voltage, $V_S$, where derivative of the BER curve is most negative and the second combined voltage is slice voltage, $V_S$, where derivative of the BER curve is most positive.

8. The method recited in claim 7 wherein the first combined voltage and the second combined voltage for each delay time are displayed as an eye diagram.

9. A method of displaying an eye diagram on an error performance analyzer comprising:
    a. receiving a first bit sequence having 0-bits signified by a first bit voltage, $V_{LB}$, and 1-bits signified by a second bit voltage, $V_{HB}$, the bits of the first bit sequence having a period;
    b. determining, beginning at a first delay time and repeating at each incremental time thereafter until at least one period is spanned, a first combined voltage spread and a second combined voltage spread of the bits of the first sequence by comparing the first bit sequence to a second bit sequence, the second bit sequence substantially similar to the first bit sequence; and
    c. displaying the first combined voltage spreads and second combined spreads.

10. The method recited in claim 9 wherein the first combined voltage spread and the second combined voltage spread are determined by obtaining bit error rate (BER) curve at the first delay, the BER curve spanning from a low slice voltage to a high slice voltage wherein the low slice voltage is less than the first bit voltage and wherein the high slice voltage is greater than the second bit voltage.

11. The method recited in claim 10 wherein the first combined voltage spread is a range of slice voltages around where derivative of the BER curve is most negative.

12. The method recited in claim 10 wherein the second combined voltage is a range of slice voltages where around where derivative of the BER curve is most positive.

13. The method recited in claim 10 wherein a BER curve is obtained at each incremental delay time following the first delay time.

14. The method recited in claim 13 wherein a derivative of each of the BER curve is taken to determine the first combined voltage spread and the second combined voltage spread for each delay time.

15. The method recited in claim 14 wherein the first combined voltage spread is a range of slice voltages around where derivative of the BER curve is most negative, and the second combined voltage spread is a range of slice voltages where derivative of the BER curve is most positive.

16. The method recited in claim 15 wherein the first combined voltage spread and the second combined voltage spread for each incremental delay time are displayed as an eye diagram.

17. An apparatus for displaying an eye diagram, the apparatus comprising:

a processor;

storage connected to the processor, the storage including instructions for the processor to a. receive a first bit sequence having 0-bits signified by a first bit voltage, $V_{LB}$, and 1-bits signified by a second bit voltage, $V_{HB}$, the bits of the first bit sequence having a period;

b. determine, beginning at a first delay time and repeating at each incremental time thereafter until at least one period is spanned, a first combined voltage spread and a second combined voltage spread of the bits of the first sequence by comparing the first bit sequence to a second bit sequence, the second bit sequence substantially similar to the first bit sequence; and c. display the first combined voltage spreads and second combined spreads.

18. The apparatus recited in claim 17 wherein the first combined voltage spread and the second combined voltage spread are determined by obtaining bit error rate (BER) curve at the first delay, the BER curve spanning from a low slice voltage to a high slice voltage wherein the low slice voltage is less than the first bit voltage and wherein the high slice voltage is greater than the second bit voltage.

19. The apparatus recited in claim 18 wherein the first combined voltage spread is a range of slice voltages around where derivative of the BER curve is most negative.

20. The apparatus recited in claim 18 wherein the second combined voltage is a range of slice voltages around where derivative of the BER curve is most positive.

21. The apparatus recited in claim 18 wherein the storage further comprises instructions for the processor to obtained a BER curve at each incremental delay time following the first delay time.

22. The apparatus recited in claim 21 wherein the storage further comprises instructions for the processor to take a derivative of each of the BER curve to determine the first combined voltage spread and the second combined voltage spread for each delay time.

23. The apparatus recited in claim 22 wherein the first combined voltage spread is a range of slice voltages around where derivative of the BER curve is most negative, and the second combined voltage spread is a range of slice voltages where derivative of the BER curve is most positive.

24. The apparatus recited in claim 23 wherein the storage further comprises instructions for the processor to display the first combined voltage spread and the second combined voltage spread for each incremental delay time as an eye diagram.

* * * * *